United States Patent
Okabe et al.

(10) Patent No.: US 7,607,880 B2
(45) Date of Patent: Oct. 27, 2009

(54) WAFER PROCESSING APPARATUS HAVING DUST PROOF FUNCTION

(75) Inventors: Tsutomu Okabe, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/706,914

(22) Filed: Nov. 14, 2003

(65) Prior Publication Data
US 2004/0147122 A1    Jul. 29, 2004

Related U.S. Application Data

(63) Continuation-in-part of application No. 10/330,092, filed on Dec. 30, 2002.

(51) Int. Cl.
*H01L 21/677*    (2006.01)
*B65G 1/133*    (2006.01)

(52) U.S. Cl. .................. 414/217.1; 414/217; 414/935; 414/939

(58) Field of Classification Search ............ 156/345.31, 156/345.32; 118/719; 414/937
See application file for complete search history.

(56) References Cited

U.S. PATENT DOCUMENTS

| | | | |
|---|---|---|---|
| 5,139,459 A | 8/1992 | Takahashi et al. | |
| 5,772,386 A | 6/1998 | Mages et al. | |
| 6,071,059 A | 6/2000 | Mages et al. | |
| 6,082,948 A | 7/2000 | Fishkin et al. | |
| 6,186,331 B1 | 2/2001 | Kinpara et al. | |
| 6,352,403 B1 | 3/2002 | Fishkin et al. | |
| 6,375,403 B1 | 4/2002 | Mages et al. | |
| 6,473,996 B1 * | 11/2002 | Tokunaga | .................... 34/417 |
| 6,530,736 B2 * | 3/2003 | Rosenquist | ................. 414/411 |
| 2001/0048866 A1 * | 12/2001 | Sakiya et al. | ............... 414/217 |
| 2002/0064439 A1 * | 5/2002 | Otaguro | .................. 414/217.1 |
| 2002/0106267 A1 * | 8/2002 | Fujii et al. | .................. 414/217 |

FOREIGN PATENT DOCUMENTS

JP    2-65607    3/1990

(Continued)

OTHER PUBLICATIONS

IFE Integrated Front End System, PRI Automation, OEM Systems, Front End Manual, 4000-0165 Rev A, Dec. 1998, with addendum dated Nov. 15, 1999 (system specs).

*Primary Examiner*—Karla Moore
(74) *Attorney, Agent, or Firm*—Oblon, Spivak, McClelland, Miaer & Neustadt, L.L.P.

(57) ABSTRACT

The wafer processing apparatus includes a chamber that is pressurized to a pressure that is higher than the pressure of the exterior thereof, an opening portion through which the interior and the exterior of the chamber are in communication with each other, and a door that closes the opening portion. When the opening portion is closed by the door, a portion of the opening remains as an aperture uncovered by the door. In conventional semiconductor wafer processing apparatus, the interior of the apparatus is sealed and pressurized in order to keep a high degree of cleanness in the wafer processing portion, and therefore airflow is generated due to a pressure difference between the interior and the exterior of the apparatus. With the above feature of the invention, it is possible to suppress creation of such airflow and prevent dust from entering the wafer processing apparatus to eliminate wafer contamination.

10 Claims, 7 Drawing Sheets

FOREIGN PATENT DOCUMENTS

| | | |
|---|---|---|
| JP | 2-137951 | 5/1990 |
| JP | 3-184479 | 8/1991 |
| JP | 2525284 | 8/1996 |
| JP | 2722306 | 3/1998 |
| JP | 2757102 | 5/1998 |
| JP | 2850279 | 1/1999 |
| JP | 2864458 | 3/1999 |
| JP | 11-145244 | 5/1999 |
| JP | 2000-164688 | 6/2000 |
| JP | 2002-76093 | 3/2002 |

* cited by examiner

WAFER PROCESSING APPARATUS HAVING DUST PROOF FUNCTION

CROSS REFERENCE TO RELATED APPLICATION

The present application is a Continuation-in-Part of application Ser. No. 10/330,092, which was filed on Dec. 30, 2002, the disclosure of which is incorporated by reference herein in its entirety.

BACKGROUND OF THE INVENTION

1. Field of the Invention

The present invention relates to a wafer processing apparatus having dust proof function used in manufacturing processes for semiconductor devices, electronic parts and related products, or optical disks etc. The dust proof function is a function to prevent dust that is generated due to an opening/closing operation of an opening portion of the processing apparatus from entering the interior of the processing apparatus, when a semiconductor wafer (which will be simply referred to as wafer hereinafter) is transferred from a clean box for storing wafers into the processing apparatus through the opening portion of the processing apparatus for processing.

2. Related Background Art

Manufacturing of wafers, which are used for semiconductor devices etc., must be performed under a condition in which a high degree of cleanness is ensured. Therefore, the manufacturing of wafers was generally performed in a clean room the whole interior of which is kept in a highly clean condition. However construction and maintenance of a large clean room with a high degree of cleanness require a significant initial investment and service costs. In addition, even if once a plant investment is made for such a clean room, a modification of the layout of the room might be required later due to a modification in the manufacturing process, which would require a large additional investment. Therefore, use of clean rooms is uneconomical. In view of the above-described situation, recently a certain method has been widely adopted, that is, to keep a high degree of cleanness not within the whole interior space of a room but only within a small environmental space (which will be referred to as a mini-environment) inside a processing apparatus to attain the effects same as those obtained by keeping a high degree of cleanness within the whole of the room. (In the following, a processing apparatus that adopts this method will be called a clean apparatus.)

Specifically, in that method, clean apparatus are set in a manufacturing room with a certain layout, and wafers are transferred from one clean apparatus to another within a wafer storage container (which will be referred to as a clean box hereinafter) whose interior is kept in a highly clean condition. The clean box is attached to a predetermined opening provided on a clean apparatus in such a way as to prevent dust from entering from the exterior, and the wafers are brought into and out of the clean apparatus through that opening. Thus, the space to which the wafers are exposed can be always kept highly clean without a need for establishing a highly clean condition within the whole interior of the manufacturing room. Therefore, this method realizes the effects same as those attained by establishing a clean room condition within the whole of the room, and so it is possible to reduce construction and maintenance costs to realize an effective manufacturing process.

In the above-described clean apparatus, in order for the mini-environment to be kept in a highly clean condition, the pressure within the mini environmental portion is arranged to a pressure $(P_a+\Delta P)$ that is higher than the external ambient pressure (represented here as $P_a$, which is generally the atmospheric pressure) by a predetermined pressure difference $(\Delta P)$. This creates an overall airflow from the interior of the mini-environment to the exterior thereof, so that dust would be exhausted to the exterior. In addition, airflow from the exterior can be prevented from entering the mini-environment, which prevents dust in the exterior from entering the mini-environment.

Conventionally, the general understanding has been that if the mini-environment is sealed as tight as possible, it is possible to prevent external dust from entering and to establish a high degree of cleanness. Therefore, the mini-environment is isolated from the external environment and placed in a completely sealed state by a door that closes the opening provided on the mini-environment except when the mini-environment is connected with the clean box for transferring of the wafer.

In the conventional apparatus as described above, since the mini-environment is isolated from the exterior or the ambient except for during the transfer of a wafer, the wafer in the interior is kept in a highly cleans condition. However, when the door is opened for transferring of the wafer, airflow from the interior of the mini-environment to the exterior is created due to the above-described pressure difference $\Delta P$ between the interior and the exterior of the mini-environment, which causes the following problem.

As described above, as long as an additional pressure is applied to the interior of the mini-environment, the airflow is inevitably created when the door is opened. In the conventional apparatus, the pressure difference $\Delta P$ is especially large at the moment when the door is opened. Therefore, the flow rate of the airflow created at the moment of opening the door is larger than the flow rate created by a pressure difference $\Delta P$ after elapse of a certain time. In addition, the airflow generated at the moment of opening the door involves significant turbulence.

On the other hand, the pressure in a clean box is substantially equal to the atmospheric pressure, and therefore, when airflow involving turbulence is generated at the opening, the airflow will be drawn into the interior of the clean box. The airflow flowing out of the opening generally includes dust to be exhausted from the interior of the mini-environment. In addition, dust in the exterior is also stirred up by the airflow. Therefore, the airflow drawn into the clean box includes dust, which will contaminate the wafers inside the clean box to deteriorate the quality of the wafers.

SUMMARY OF THE INVENTION

An object of the present invention is to reduce creation of the above-described airflow involving turbulence at the opening to provide a wafer processing apparatus in which such airflow is not drawn into the interior of a clean box.

Another object of the invention is to suppress creation of the above-mentioned airflow to prevent contamination of wafers by providing a wafer processing apparatus comprising, a chamber that is pressurized to a pressure that is higher than the pressure of the exterior thereof, an first opening portion through which the interior and the exterior of the chamber are in communication with each other, and a door that closes said first opening portion, wherein when the first opening portion is closed by the door, an aperture through which the interior and the exterior of the chamber are in communication with each other remains. Specifically, the invention provides a wafer processing apparatus in which an aperture through which the interior and the exterior of the chamber are in communication with each other is present on or in the vicinity of the door under the state in which the first opening portion is closed by the door. The aperture that is present under the state in which the first opening portion is closed by the door may typically be a chink formed around the door or a second opening formed on the door, as will be described in connection with the embodiments of the present invention.

A still other object of the present invention is to provide a wafer processing apparatus in which a protruding wall is provided in the circumference of the opening and along the edge of the opening. With this aspect of the invention, it is possible to prevent dust that is stirred up by the above-mentioned airflow from entering the clean box and to enhance effects of preventing wafer contamination.

Other objects and aspects of the invention will become apparent from the following description of embodiments with reference to the accompanying drawings.

DETAILED DESCRIPTION OF THE PREFERRED EMBODIMENTS

Embodiment 1

Figure 1:
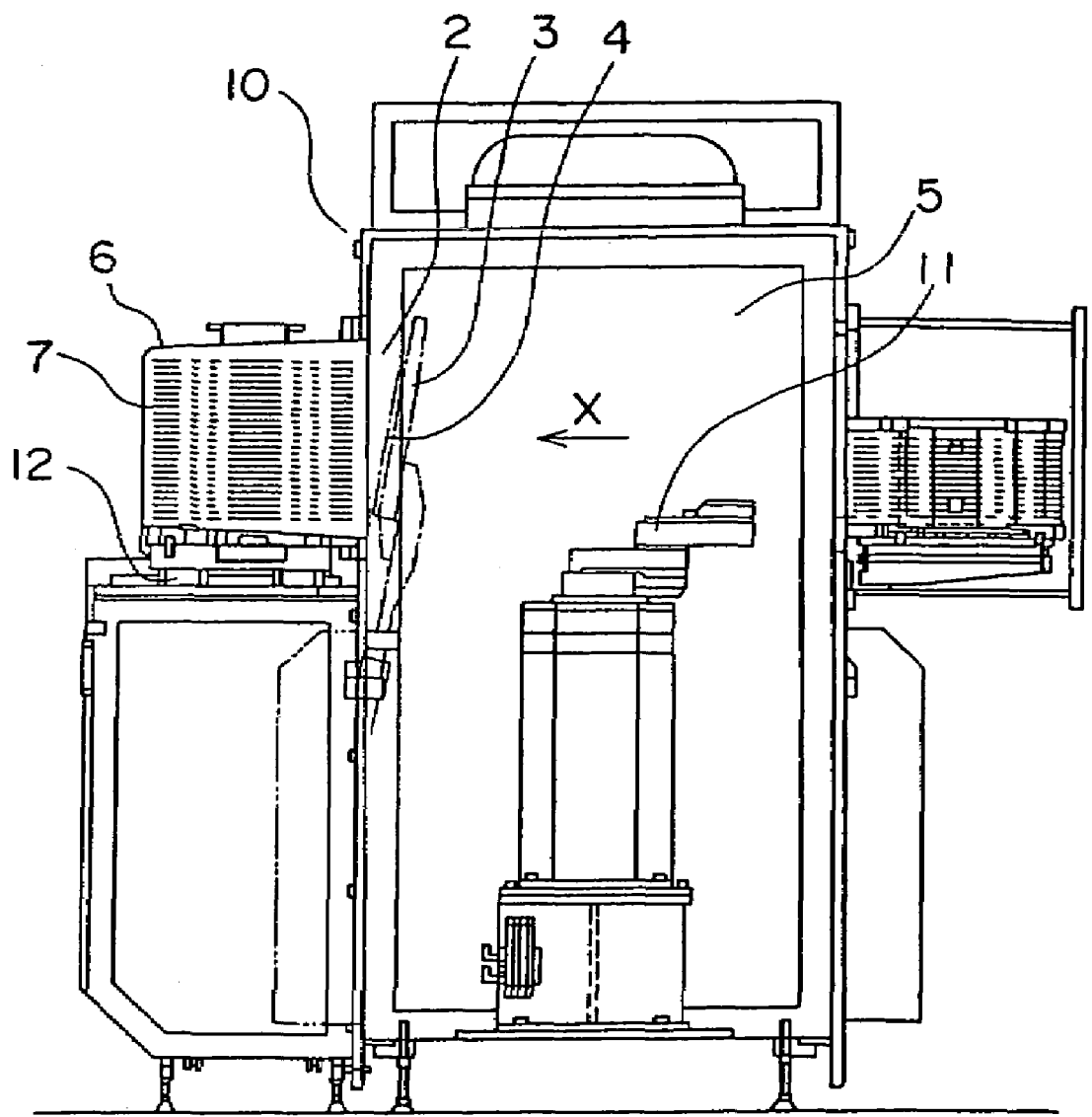
FIG. 1 is an overall view showing a wafer processing apparatus to which the present invention is applied.

In the following an embodiment of the present invention will be described with reference to annexed drawings. FIG. 1 is a drawing showing the overall structure of a semiconductor wafer processing apparatus 10. The semiconductor wafer processing apparatus includes a mini-environment portion 5, in which a robot arm 11 is provided. The interior of the mini-environment portion 5 is pressurized to a pressure that is higher than the ambient pressure (that is generally, the atmospheric pressure) outside the semiconductor wafer processing apparatus 10.

Figure 2:
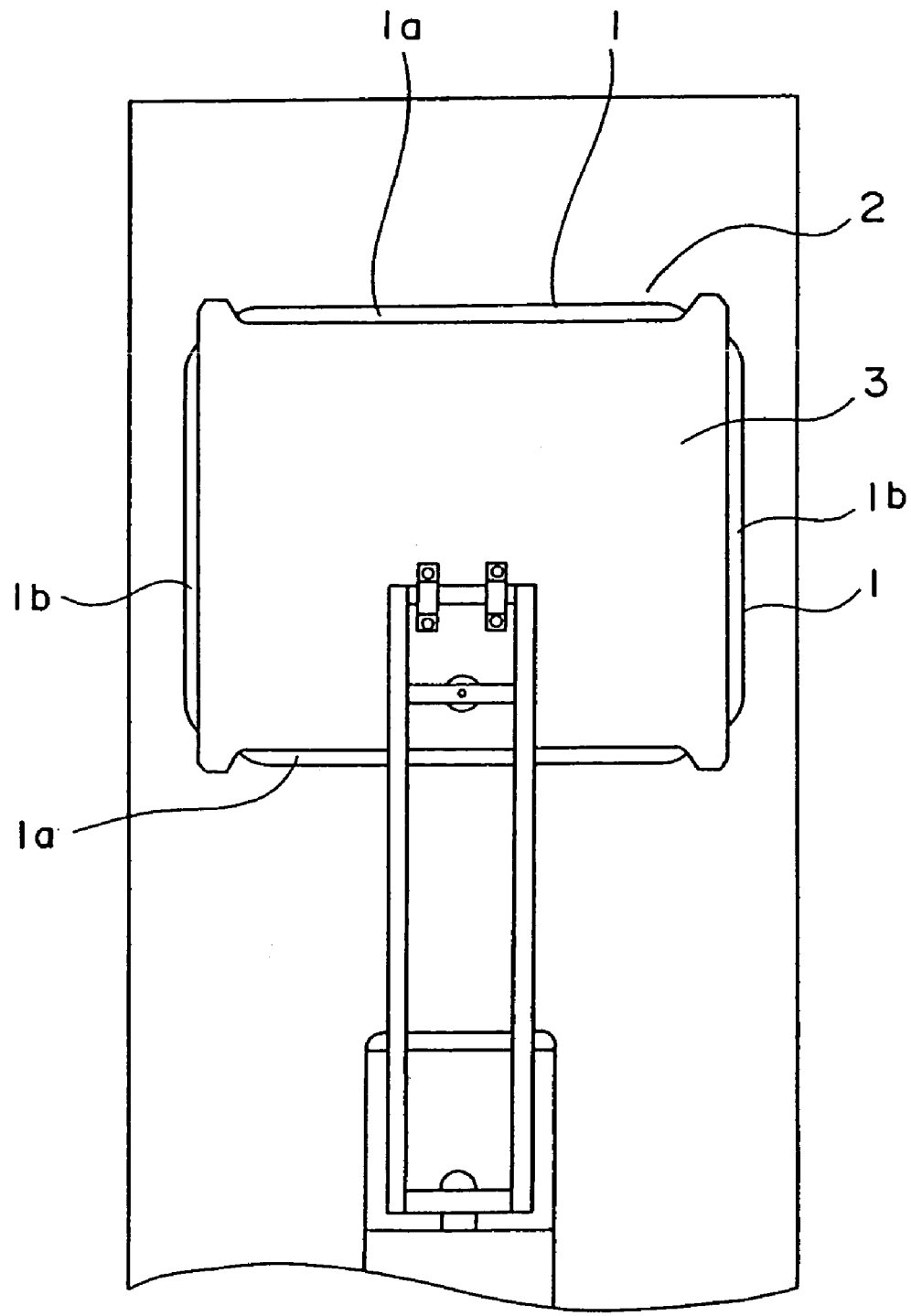
FIG. 2 is a drawing showing a portion including an opening of a semiconductor processing apparatus according to the first embodiment.

The mini-environment portion 5 has a window opening 2 through which the robot arm 11 receives wafers 7. FIG. 2 is a drawing showing the window opening 2 as seen from the interior of the mini environment portion 5 (that is, as seen in the direction indicated by arrow X in FIG. 1). The window opening 2 is closed by a door 3 as shown in FIG. 2, when the transferring of wafers 7 is not performed. Upon opening the window opening 2, the door 3 is swung about a pivot that is provided in the vicinity of a driving portion to shift to a position shown by the dashed line in FIG. 1. At that position, the door 3 is spaced apart from the opening and in an inclined state. Then, the door 3 is moved downward from the position shown by the dashed line. In connection with this, the door 3 is adapted to be driven by the driving portion to move up and down (in the up-and-down direction in FIG. 1). When the window opening 2 is to be closed by the door 3, the door 3 is moved following a sequential process that is reverse to the above-described process.

A clean box 6 is used for transferring wafers 7 from one wafer processing apparatus 10 to another. The wafers 7 are accommodated in the clean box 6, which is closed by a clean box door 4 in a highly airtight manner. Thus, when the wafers 7 are accommodated in the clean box 6, the interior of the clean box 7 is ensured to be in a highly clean condition. The interior of the clean box may be filled with a gas such as nitrogen of high purity.

The semiconductor processing apparatus 10 is provided with a docking plate 12 on which the clean box is to be placed. The docking plate 12 is movable in the horizontal direction in FIG. 1 or FIG. 3, along a rail provided below it. The docking plate is driven by a driving mechanism (e.g. an air cylinder), which is not shown in the drawings, so that the docking plate can move toward and away from the mini-environment portion 5. When the clean box 6 is placed on the docking plate 12 and moved toward the mini-environment portion 5, the vertical position (in the vertical direction of the window opening 2) and the horizontal position (in the horizontal direction of the window opening 2) of the clean box are adjusted in such a way that the clean box door 4 is fitted to the window opening 2. At that time, the clean box 6 that has been brought closer the mini-environment portion 5 is not in contact with the mini-environment portion 5, but the docking plate 12 is arranged to be stopped at a stop position at which a clearance 14 is formed between the clean box 6 and the mini-environment portion 5. The clearance 14 is formed between the peripheral end portion of the clean box 6 facing the window opening 2 and the outer wall of the mini-environment portion 5. The clearance is about 2 mm.

As shown in FIG. 2, the sizes of the door 3 and the window opening 2 are designed in such a way that when the window opening 2 is closed by the door 3, apertures or chinks 1 remain between the wall near window opening 2 and the door 3 as seen from the interior of the mini-environment portion. It should be noted that in FIG. 2 the chinks 1 are illustrated in an exaggerated manner in order to facilitate visualization thereof. A preferable form of the chinks 1 in this embodiment will be described later.

It is preferable that the chinks 1 are uniformly formed around the door 3 in the closed state so as not to trouble air flow from the interior of mini-environment portion 5 to the exterior thereof to create an air flow involved into inner space of a clean box 6. However, if the chinks 1 are formed around the door 3 in the closed state, it is necessary for providing means for determining whether the door is stopped or not at a predetermined position of closing the window opening 2, for acknowledging an appropriate stop position, or the like. As for such means, it may be considered for example to provide a system for controlling the stop position onto a driving system (not shown) for driving the door 3. On the other hand, the system provided on the driving system may not easily recognize the appropriate stop position or may make the system complicated, and therefore, such system is not proper countermeasure.

In consideration of the above, in the present invention, projections 3a are formed at respective four corners of the door 3 so as to be respectively in contact with periphery of the outer wall of mini-environment portion 5 around the window opening 2 so that the stop position of the door 3 is controlled. This countermeasure slightly reduces an effect obtained by the chinks 1, but can simply and easily control the stop position of the door 3. In addition, it is considered that above described position of projections 3a is farthest from the opening of the clean box 6 or wafers housed within the clean box 6, and therefore turbulent air flows caused by the projections 3a have least influence on interior of the clean box 6. Furthermore, by forming the shape of the projection appropriately, it is possible to reduce the turbulence of air flow.

As described above, the positions of projections 3a are designed in consideration that the influence of the turbulent air flows upon the clean box should be minimum. However, if the condition of the clean box 6, mini-environment portion 5 or the like is, for example arranged such that a factor such as the pressure difference between the interior and the exterior of the mini-environment portion 5 reduces the influence of the turbulent air flows, the number of projections can be varied or locations of the projections can be changed to more proper position on the apparatus.

Figure 3:
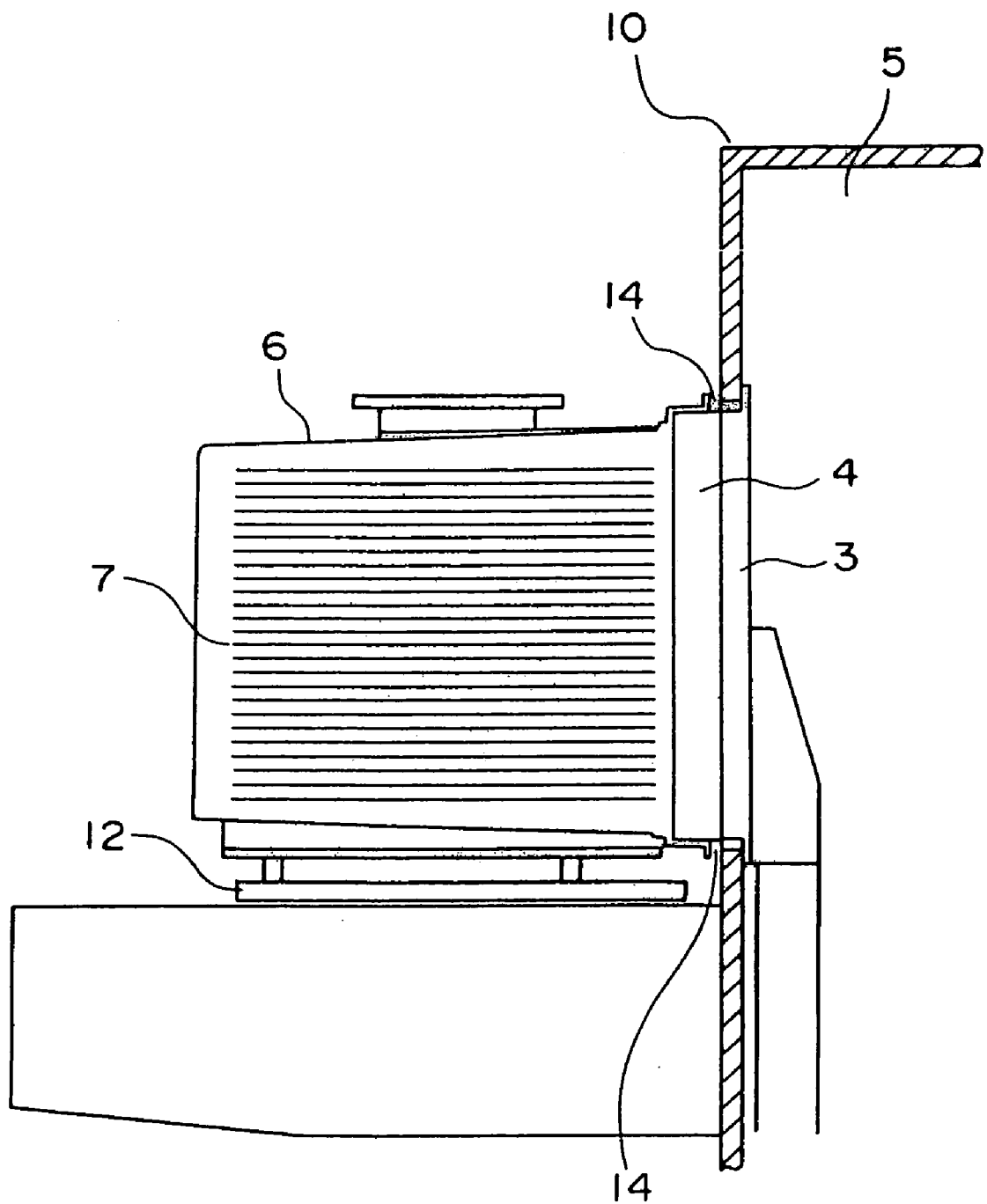
FIG. 3 is a drawing schematically showing a cross section of the apparatus of the first embodiment under the state in which an opening of a mini-environment portion is closed by a door.

In addition, in the present invention, the apparatus is designed such that an end part at the window opening 2 side of the clean box 6 is set so as not to be in contact with the outside surface of the mini-environment portion 5, but so as to make the clearance 14. Furthermore, the clearance 14 is formed to close to the chinks 1. Such arrangement prevents the air flow from the interior to the exterior of the mini-environment portion 5, from rapidly changing the flow direction. In case that the air flow carries dust, if the flow direction rapidly changes, the dust is thrown off the flow and may be reached into the inner space of the clean box 6. By preventing the rapid direction change of the gas flow, the possibility that the dust carried by the air flow is reached into the inner space of the clean box 6 is remarkably reduced. In addition, the arrangement in which the clean box 6 is not in contact with the mini-environment portion 5 provides further effect of preventing the dust creation caused by the contact therebetween. Here, a description will be made of a non-transferring state during which the transferring of the wafers 7 is not performed. This state includes a stand-by state (during which the processing of a wafer 7 is not performed) and a state during which the processing of a wafer 7 is performed. In this state, the opening is being closed by the door 3 as shown in FIGS. 2 and 3. In this state, air is flowing constantly from the interior of the mini-environment portion 5 that is adapted to have a pressure higher than the ambient pressure to the exterior thereof through the chinks 1 as an aperture which still remains after closing door 3. Therefore, the pressure difference between the interior and the exterior created by the pressurization becomes small in the vicinity of the door 3.

Figure 4:
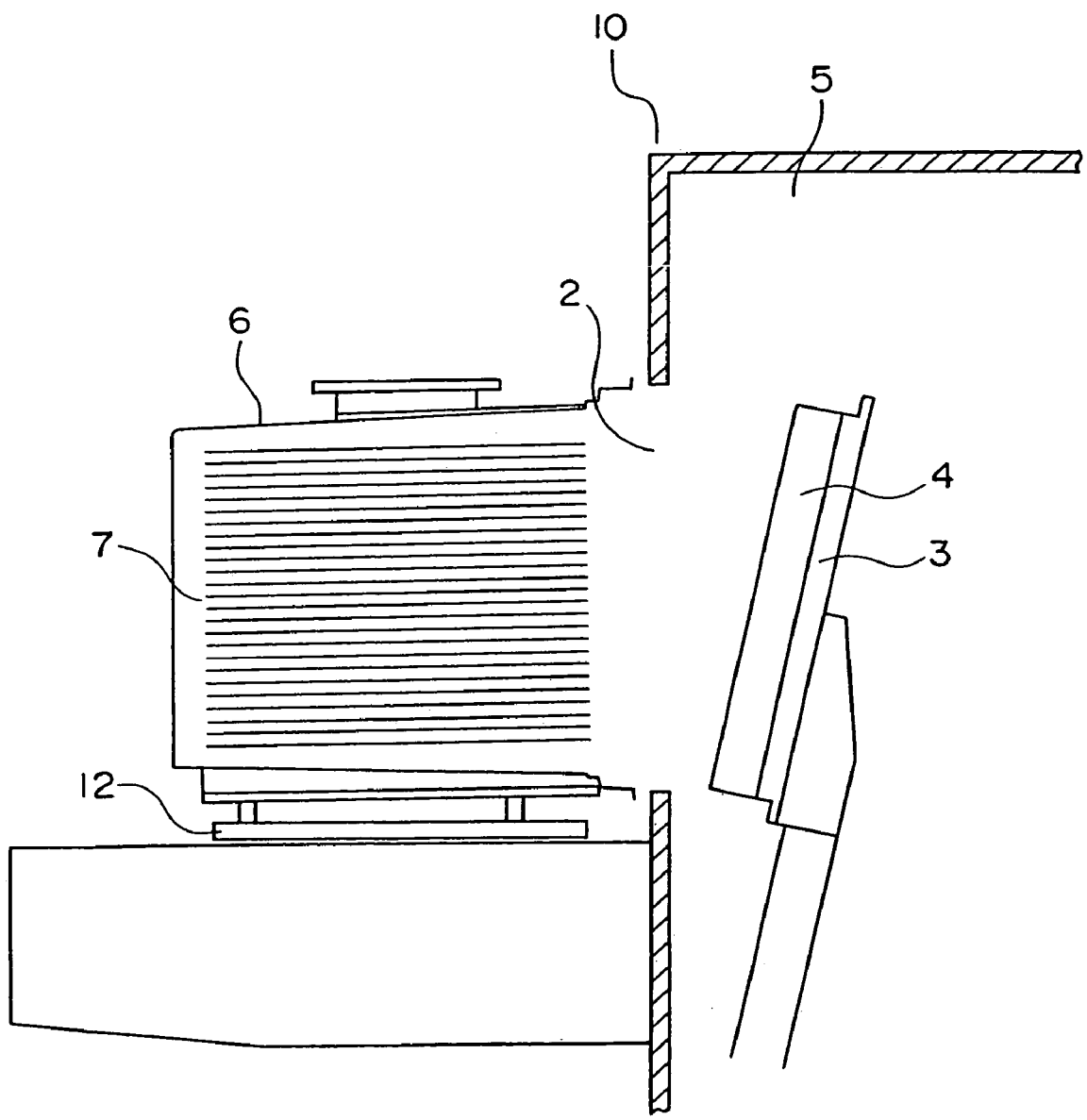
FIG. 4 is a drawing schematically showing a cross section of the apparatus of the first embodiment under the state when the door of the opening of the mini-environment portion is made open.

Next, a description will be made of a state during which the transferring of a wafer 7 from a clean box 6 is performed. This state includes a state during which a wafer 7 is brought into (or loaded to) the mini-environment portion 5 upon starting of the wafer processing and a state during which a wafer 7 is taken out of (or unloaded from) the mini-environment portion 5 upon completion of the wafer processing. After the preceding process by another processing apparatus has been completed, the clean box 6 is transferred from that processing apparatus and placed on the docking plate 12. The clean box 6 placed on the docking plate 12 is moved with a movement of the docking plate 12 to a position at which the clean box door 4 is close to the door 3 of the mini-environment portion 5 toward the window opening 2. When a surface of a member 22 of a first stopper abuts a surface of a second stopper 21, the docking plate 12 cannot move any more, namely it is stopped. After the movement of the docking plate 12 is stopped, the clean box door 4 is held by the door 3 by means of vacuum suction or other means, and the door 3 is opened together with the clean box door 4, so that the window opening 2 is made open as shown in FIG. 4. As described above, since the pressure difference between the interior and the exterior of the mini-environment portion 5 is small even in the state in which the window opening 2 is closed by the door 3, the door 3 can be opened easily without a significant resisting force caused by the pressure difference. In addition, airflow from the interior to the exterior of the mini-environment portion 5 created when the door 3 is opened is small. Therefore, contrary to conventional apparatus, airflow involving dust is not drawn into the clean box, and it is possible to prevent dust existing in the exterior of the mini-environment portion 5 and in the vicinity of the opening from being stirred up due to the creation of the airflow. Consequently, it is also possible to prevent dust from entering the clean box 6. Since the clean box 6 and the mini-environment portion 5 are not in contact with each other, the airflow that is created as the door 3 is opened does not enter the clean box 6 but flows to the exterior through window opening 2 and the clearance 14.

After that, the door 3 is moved downward by the driving portion together with the clean box door 4 held by it, and a wafer 7 is picked up and brought into the mini-environment portion 5 by the robot arm 11. After the wafer 7 is set at a prescribed position in the mini-environment portion 5, the door 3 is moved upward by the driving portion to close the window opening 2 by causing the projections 3a to contact with periphery of the window opening 2.

In the arrangement of the present invention, gap of the chinks 1 and the clearance 14 (and pressure in the mini-environment 5) are set such that a flow rate or volume of gas (air in the present embodiment) which flows from the interior to the exterior of the mini-environment portion 5 through the chinks 1 in the state in which the door 3 closes the window opening 2, is substantially equal to a flow rate of gas which flows through a gas flow path which is formed between the clean box 6 and the mini-environment portion 5 when the wafer 7 is transferred from or into the inner space of the clean box 6. As the result, irrespective of the state of the door 3, a certain flow rate of the gas flowing from the interior to the exterior of the mini-environment portion 5 is assured constantly. Hence, even if the door 3 moves to the opening state, rapid change of the gas flow rate can be prevented, and no gas flows into the inner space of the clean box 6 when the gas flows from window opening 2 to the exterior space through the clearance 14. Therefore, if there is dust within the mini-environment portion 5, that dust is carried by the gas flow to the exterior space, but not to be reached into the inner space of the clean box 6.

The width of the chinks 1 may be appropriately optimized in relation to the interior pressure. In this embodiment, the interior of the mini-environment is so pressurized that the interior pressure is higher than the exterior pressure (i.e. the atmospheric pressure) by 2 Pa (a typical value). Under this condition, the width of the chinks 1 is set, for example to 2 mm (a typical value). Then, each of the upper and lower chinks 1a shown in FIG. 2 will have an area of about 315 mm×2 mm, and each of the side chinks 1b shown in FIG. 2 will have an area of about 290 mm×2 mm. By providing chinks having such areas, it is possible to effectively prevent dust in the exterior from entering the interior and to prevent creation of airflow including dust due to a pressure difference between the interior and the exterior of the mini-environment portion 5. This is an advantageous effect of the present invention.

Figure 5:
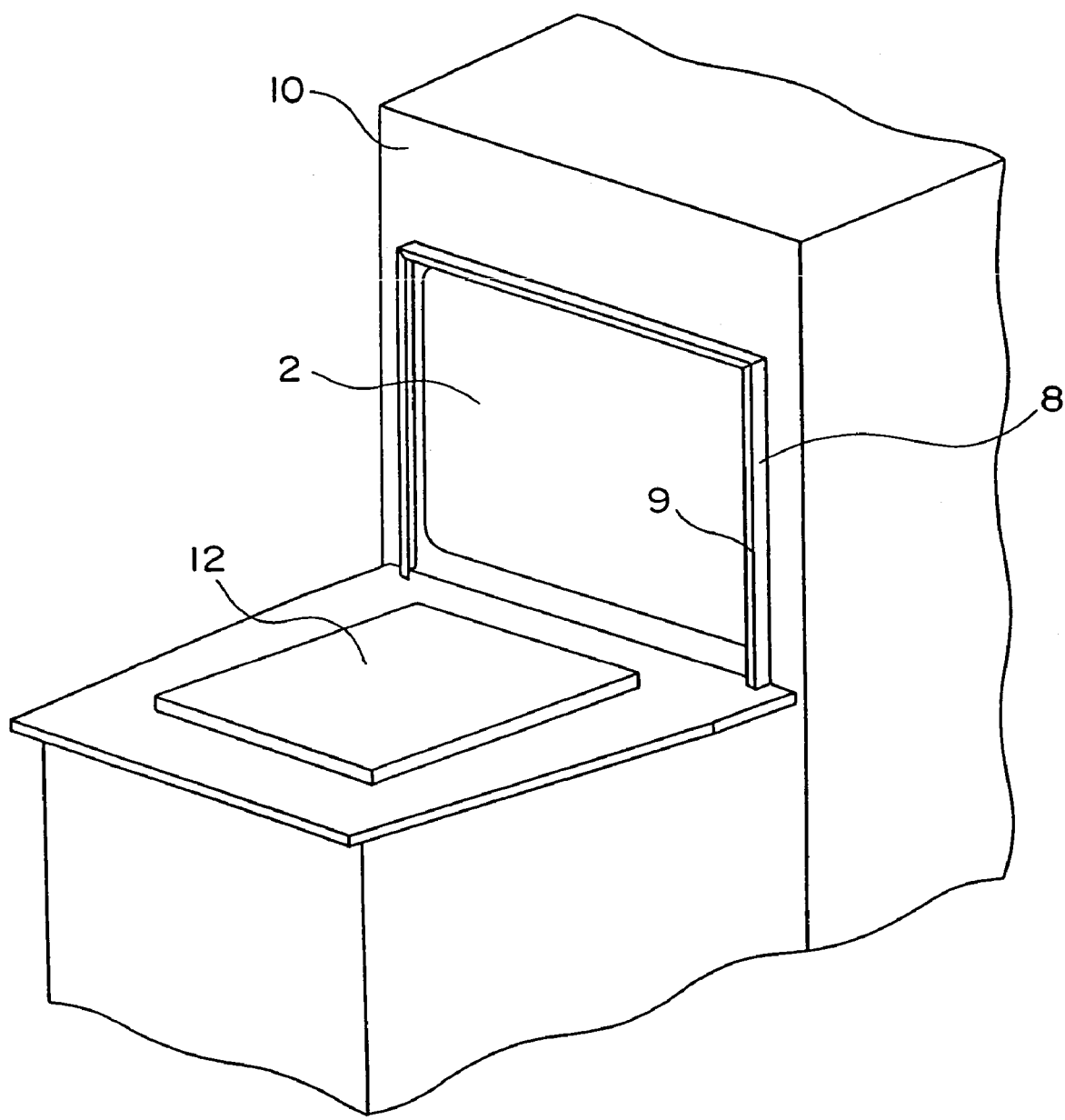
FIG. 5 is a perspective view showing a portion of the apparatus of the first embodiment, which is provided with a protruding wall having an eaves.

In addition to the reduction of the creation of airflow involving dust attained by the chinks 1, contamination of the wafers 7 can be further reduced by proving a protruding wall 8 disposed on the outer surface of the mini-environment and in the circumference of the window opening 2 as shown in FIG. 5. The protruding wall 8 may comprise, for example, a plate-like member provided at the circumference of the window opening 2 along its edge, extending substantially perpendicular to the wall of the mini-environment portion 5. The thickness of the protruding wall 8 would be designed in such a way that the protruding wall 8 has a certain degree of strength with which its shape will be preserved even if something collides against it. On the other hand, the height of the protruding wall 8 would be so designed as to prevent dust from entering the clean box with airflow. In this embodiment, the height of the protruding wall is 22 mm (a typical value).

If the apparatus is provided with the protruding wall 8 having the above-mentioned height, even when dust existing in the exterior of the mini environment portion 5 and in the vicinity of the window opening 2 is starred up by airflow, the protruding wall 8 would block or prevent the dust from entering the clean box 6.

Furthermore, the advantageous effects of the protruding wall 8 can be enhanced by providing an eaves 9 on the protruding wall 8 as shown in FIG. 5. The eaves 9 may comprise, for example, a plate-like member that is provided on the top or the protruding wall (i.e. the end of the portion of the protruding wall opposite to the wall of the mini-environment) and extending inwardly toward the opening. The length of the inward extension may be appropriately determined in such a way that it would not interfere with the flange portion of the clean box, when the flange portion is connected to the window opening 2. Generally, the larger the width of the eaves is, the more effectively it can prevent dust from entering the clean box. However, on the other hand, a large eaves width would deteriorate accessibility in connecting the clean box to the opening. For example, in this embodiment, the width of the eaves is designed to be 2 mm (a typical value).

As described above, additional advantageous effects are realized, in addition to the advantageous effects of the chinks 1, by providing the protruding wall 8 with or without the eaves 9.

In order to realize the advantageous effects, the protruding wall 8 is not necessarily required to be provided in combination with the chinks 1. Even when only the protruding wall 8 is provided without the provision of the chinks 1, the advantageous effect of preventing external dust from entering the interior of the mini-environment or the clean box can be realized.

Embodiment 2

Figure 6:
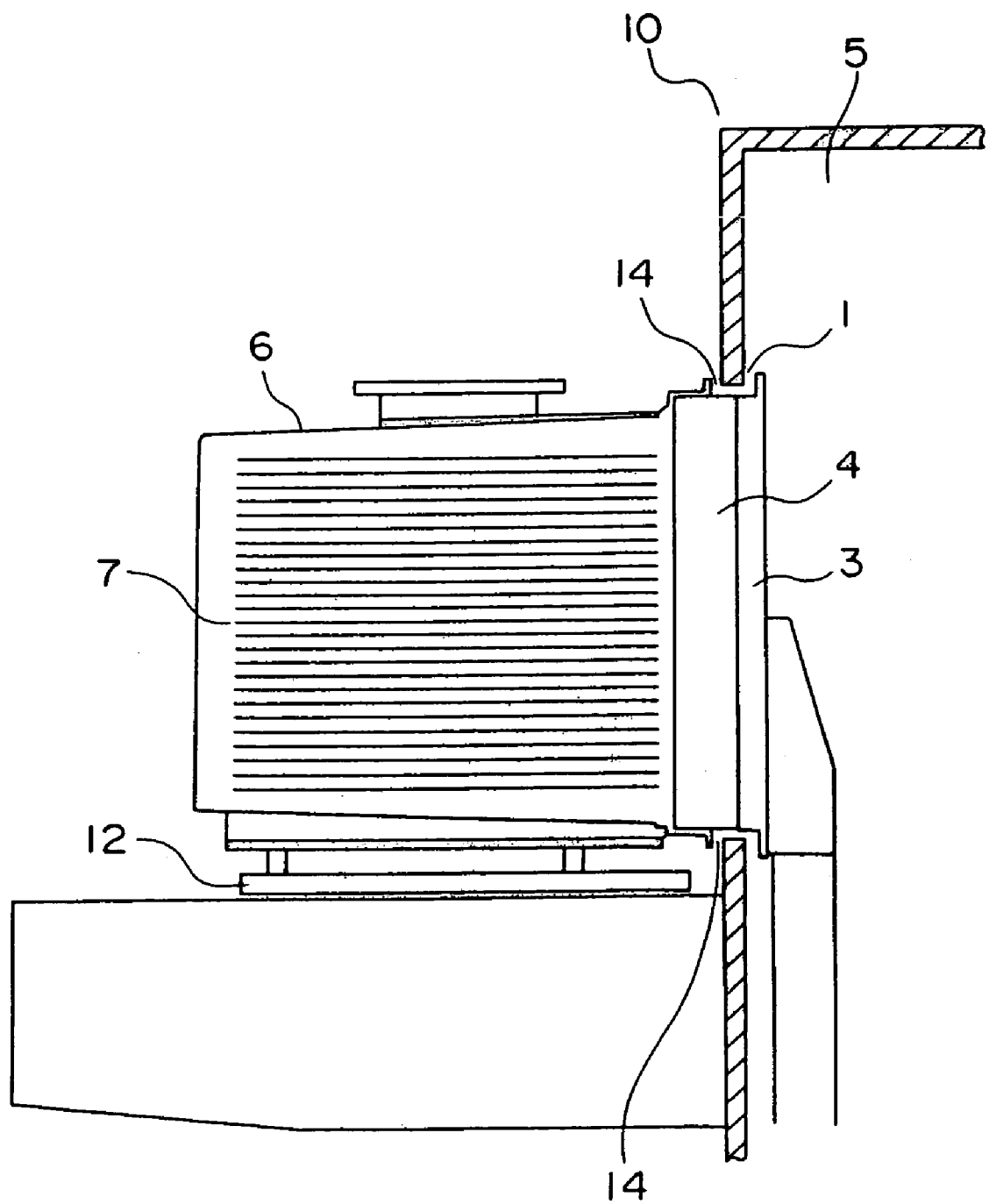
FIG. 6 is a drawing schematically showing a chink defined by a door and a wall of the mini-environment portion according to the second embodiment under the state in which the opening of the mini-environment portion is closed by the door.

In the above-described first embodiment, the chinks 1 are formed as partial areas of the window opening 2 that remain uncovered by the door 3 when the door 3 is in contact with the wall of the mini-environment portion 5. However, the form of the chink 1 is not limited to that. As shown in FIG. 6, the chink 1 may also be formed, for example, as a chink or clearance that is formed between the door 3 and the wall of the mini-environment portion 5 under a state in which the door 3 is positioned, for covering the window opening 2, in such way that any part of the door 3 is not in contact with the wall of the mini-environment portion 5. As will be understood from the above, the advantageous effects similar to the effects of the first embodiment can be realized as long as the chink has an size that does not easily allow entrance of external dust and can reduce the pressure difference between the interior and the exterior of the mini-environment 5.

Like in the first embodiment, the effect of preventing the entrance of dust can be improved also in this second embodiment by providing a protruding wall 8 with or without an eaves 9.

Embodiment 3

Figure 7:
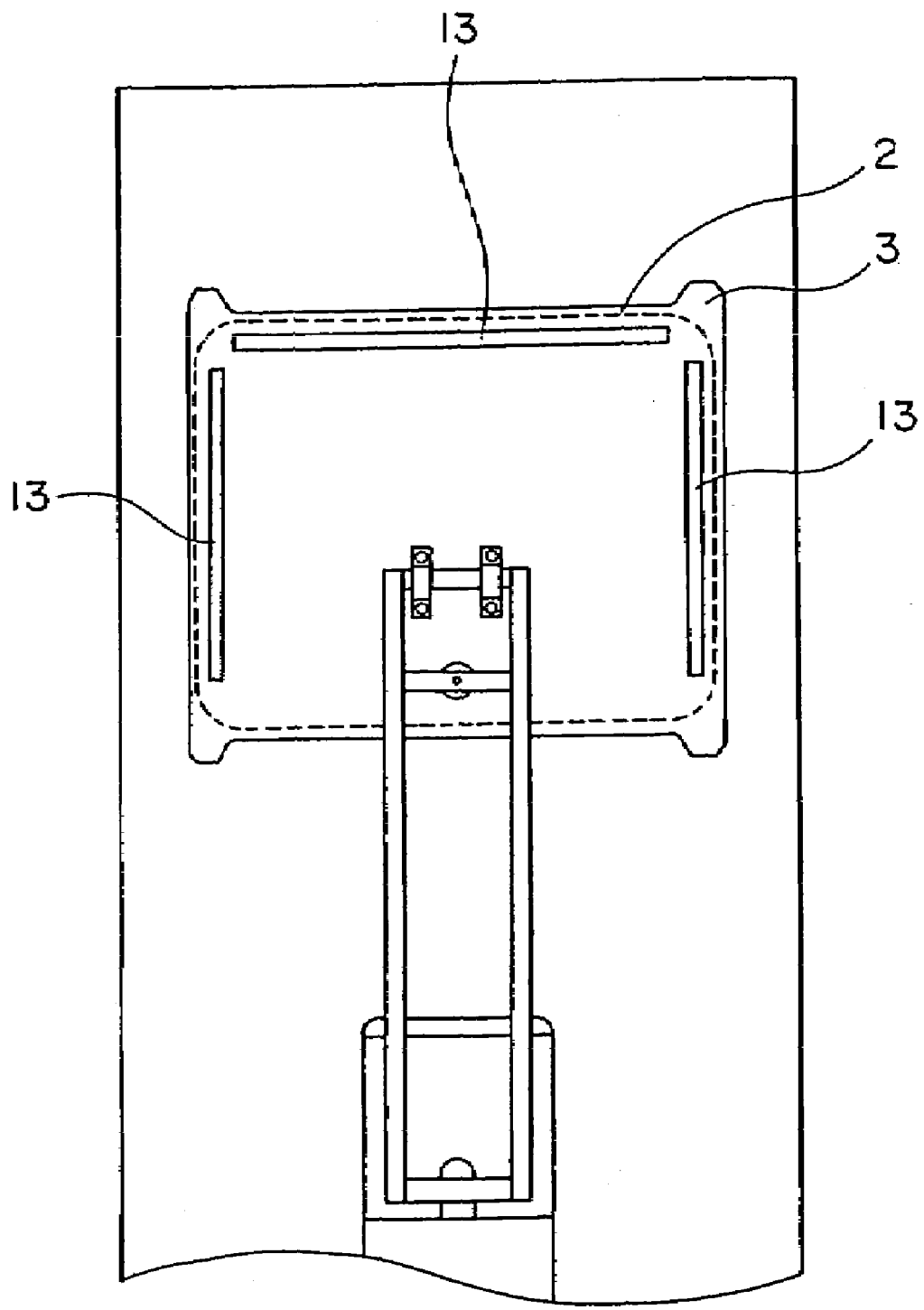
FIG. 7 is a drawing showing a second opening in a semiconductor wafer processing apparatus according to the third embodiment.

In the above-described second embodiment, the chink 1 is defined between the door 3 and the window opening 2. However, as shown in FIG. 7, second openings (or apertures) 13 may be provided on the door 3. For example, the second openings 13 are provided at peripheral portions on the door 3, while the door is configured to completely cover the window opening 2 (shown by the broken line in FIG. 7) when it is in the position for covering the opening. In this case also, the interior of the apparatus is in communication with the exterior through the second opening on the door 3. Therefore, the pressure difference between the interior and the exterior is reduced and advantageous effects similar to those in the first or second embodiment can be realized.

Like in the first embodiment, the effect of preventing the entrance of dust can be improved also in this third embodiment by providing a protruding wall 8 with or without an eaves 9.

While in the first to third embodiments, an opening(s), such as the chinks 1, that has an elongated shape is adopted, the present invention is not limited to such an elongated shape of the opening in realizing the advantageous effects. However, as is the case with the above-described first to third embodiments, the openings that are arranged uniformly in the vicinities of the four sides of the door are advantageous and preferable in reducing the pressure gradient on the plane of the door. Therefore, a set of the chinks 1 is the most effective form.

The present invention realizes the following advantageous effects.

(1) In semiconductor wafer processing apparatus, with the provision of an aperture under the state in which an opening for allowing transfer of wafers into the mini-environment portion serving as a wafer processing portion is closed by a door, it is possible to reduce creation of airflow to prevent contamination of wafers with dust.

(2) With the provision of an protruding wall with or without an eaves along the edge of the opening, it is possible to prevent wafers from being contaminated by dust that is stirred up by airflow created when the door is opened.

While the described embodiment represents the preferred form the present invention, it is to be understood that modifications will occur to those skilled in that art without departing from the spirit of the invention. The scope of the invention is therefore to be determined solely by the appended claims.

The invention claimed is:

1. A wafer processing apparatus including a mini-environment portion having a chamber including a chamber wall therein and configured to transfer a wafer between a clean box having a housing with an opening configured to be closed by a lid to house the wafer in the housing and the chamber, wherein the housing has a flange extending from the opening of the clean box toward a side opposite to the opening and in a surface-plane direction of the opening of the clean box around an entire perimeter of the opening of the clean box, said apparatus comprising:

a first opening portion formed on the chamber wall, for communicating with an outside of the chamber, said first opening portion facing the opening of the clean box which allows loading or unloading the wafer between the clean box and the chamber, wherein when the wafer transferring operation is performed, the clean box is fixed to overlap the flange of the clean box over an outside surface of the wall on which the first opening portion is formed with a first clearance formed around the entire perimeter of said first opening portion, the first clearance being defined by a predetermined constant distance along an entire perimeter of the opening of the clean box between a chamber side surface of the flange and the outside surface of the chamber wall on which the first opening portion is formed wherein the clean box is settable in a manner where an outermost peripheral edge of the opening of the clean box is positioned closer to a center of said first opening portion in a direction parallel to a plane of the chamber wall than a peripheral edge of said first opening portion in the direction parallel to the plane of the chamber wall so that a part of an airflow from the inside of the chamber at the peripheral edge of said first opening portion in a direction normal to said first opening portion directly hits the chamber side surface of the flange to direct an airflow in the direction along the chamber wall.

2. A wafer processing apparatus according to claim 1, comprising a door capable of closing said first opening portion when the wafer is not transferred and opening the first opening portion when the wafer is transferred, wherein when the lid held by the door has been inserted into said first opening portion to close said first opening portion until the door has closed said first opening portion, a second clearance is formed between the door and a perimeter of said first opening portion, the second clearance communicating with the first clearance, wherein an inside of the chamber is capable of communicating with an outside of the chamber through the first and second clearances.

3. A wafer processing apparatus according to claim 2, wherein said second clearance is capable of communicating with the first clearance to form a gas flow path from the chamber to the outside of the chamber.

4. A wafer processing apparatus according to claim 2, wherein the second clearance extends within said first opening portion around an entire perimeter of said first opening portion along a direction in which said door opens.

5. A wafer processing apparatus according to claim 1, wherein the first clearance extends between the flange and the wall on which said first opening portion is formed in a direction of the wall on which said first opening portion is formed.

6. A wafer processing apparatus according to claim 1, wherein an outermost dimension of the first opening portion, in a vertical direction, is greater than an outermost dimension of the opening of the clean box, in the vertical direction.

7. A wafer processing apparatus including a mini-environment portion having a chamber therein and configured to transfer a wafer between a clean box having a housing with an opening configured to be closed by a lid to house the wafer in the housing and the chamber, wherein the housing has a flange extending from the opening of the clean box toward a side opposite to the opening and in a surface plane direction of the opening of the clean box around an entire perimeter of the opening of the clean box, said apparatus comprising:

a first opening portion formed on a wall of the chamber, for communicating with an outside of the chamber, the wall opposing to the opening of the clean box which allows loading or unloading the wafer between the clean box and the chamber; and a door configured to close said first opening portion when the wafer is not transferred and opening the first opening portion when the wafer is transferred, wherein when the wafer transferring operation is performed, the clean box is fixed to overlap the flange of the clean box over an outside surface of the wall on which the first opening portion is formed with a first clearance formed at the perimeter of said first opening portion, the first clearance being defined by a predetermined constant distance along an entire perimeter of the opening of the clean box between a chamber side surface of the flange and the outside surface of the chamber wall on which the first opening portion is formed, wherein the clean box is settable in a manner where an outermost peripheral edge of the opening of the clean box is positioned closer to a center of said first opening portion in a direction parallel to a plane of the chamber wall than a peripheral edge of said first opening portion in the direction parallel to the plane of the chamber wall so that a part of airflow from the inside of the chamber at the peripheral edge of said first opening portion in a direction normal to said first opening portion directly hits the chamber side surface of the flange to direct an airflow in the direction along the chamber wall;

wherein when the lid held by the door has been inserted into said first opening portion to close said first opening portion until the door has closed said first opening portion, a second clearance is formed between the door and a perimeter of said first opening portion, the second clearance communicating with the first clearance, and wherein an inside of the chamber is capable of communicating with an outside of the chamber through the first and second clearances.

8. A wafer processing apparatus according to claim 7, wherein the first clearance extends in a direction perpendicular to the wall on which the first opening portion is formed.

9. A wafer processing apparatus according to claim 7, wherein the second clearance extends within said first opening portion around an entire perimeter of said first opening portion along a direction in which said door opens.

10. A wafer processing apparatus according to claim 7, wherein an outermost dimension of the first opening portion, in a vertical direction, is greater than an outermost dimension of the opening of the clean box, in the vertical direction.

* * * * *